(12) United States Patent
Walley et al.

(10) Patent No.: US 7,869,779 B2
(45) Date of Patent: Jan. 11, 2011

(54) METHOD AND SYSTEM FOR PROCESSING CHANNELS IN A FM COMMUNICATION SYSTEM

(75) Inventors: John Stuart Walley, Ladera Ranch, CA (US); Rafael Sotomayor, Oceanside, CA (US); Prasan Kumar Pai, Mission Viejo, CA (US)

(73) Assignee: Broadcom Corporation, Irvine, CA (US)

( * ) Notice: Subject to any disclaimer, the term of this patent is extended or adjusted under 35 U.S.C. 154(b) by 432 days.

(21) Appl. No.: 11/755,395

(22) Filed: May 30, 2007

(65) Prior Publication Data

US 2008/0299925 A1 Dec. 4, 2008

(51) Int. Cl.
*H04B 1/18* (2006.01)
(52) U.S. Cl. .............. 455/161.3; 455/150.1; 455/154.1; 455/158.1; 455/160.1; 455/166.1
(58) Field of Classification Search ................ 455/161.3
See application file for complete search history.

(56) References Cited

U.S. PATENT DOCUMENTS

| 5,125,105 A | * | 6/1992 | Kennedy et al. | .......... 455/164.1 |
| 5,280,636 A | * | 1/1994 | Kelley et al. | ................ 455/131 |
| 2007/0010221 A1 | * | 1/2007 | Howard et al. | ........... 455/179.1 |

* cited by examiner

*Primary Examiner*—Yuwen Pan
*Assistant Examiner*—Ajibola Akinyemi
(74) *Attorney, Agent, or Firm*—McAndrews, Held & Malloy, Ltd.

(57) ABSTRACT

A method and system for processing channels in a FM communication system are provided. The FM communication system using the method or program may include adjusting a tuning frequency of a FM receiver for scanning and detecting an FM channel based on one or more of knowledge of location of said FM receiver, received signal strength indicator (RSSI), and/or carrier error of a related FM signal. Frequency offsets and channel spacing of the detected FM channels may be derived based on a self measurement routine. The aforementioned information may be preprogrammed, updated from a previous scan, or from external inputs to configure the receiver for subsequent selective tuning.

39 Claims, 10 Drawing Sheets

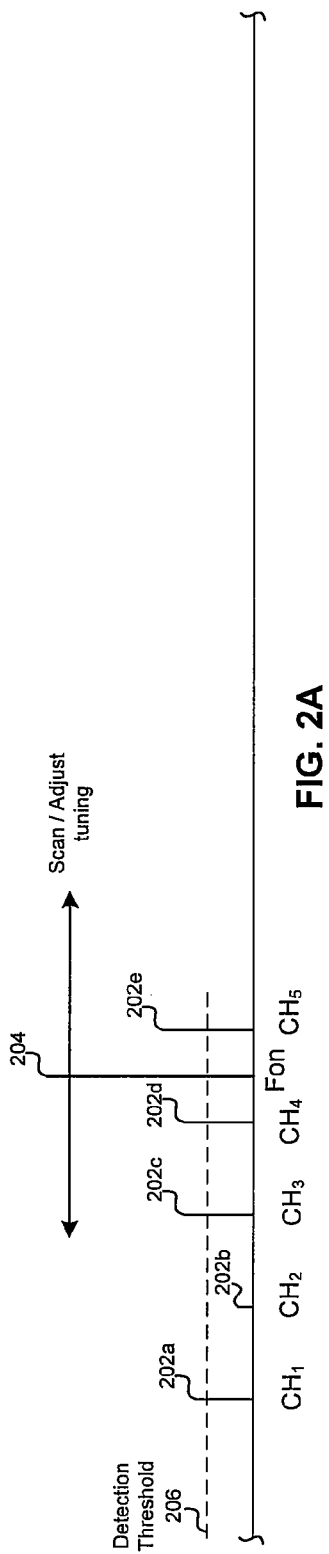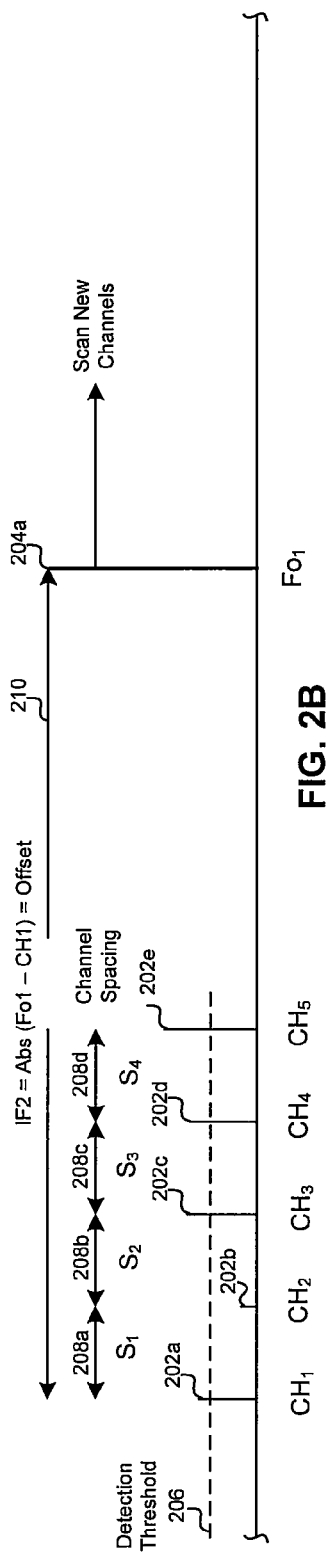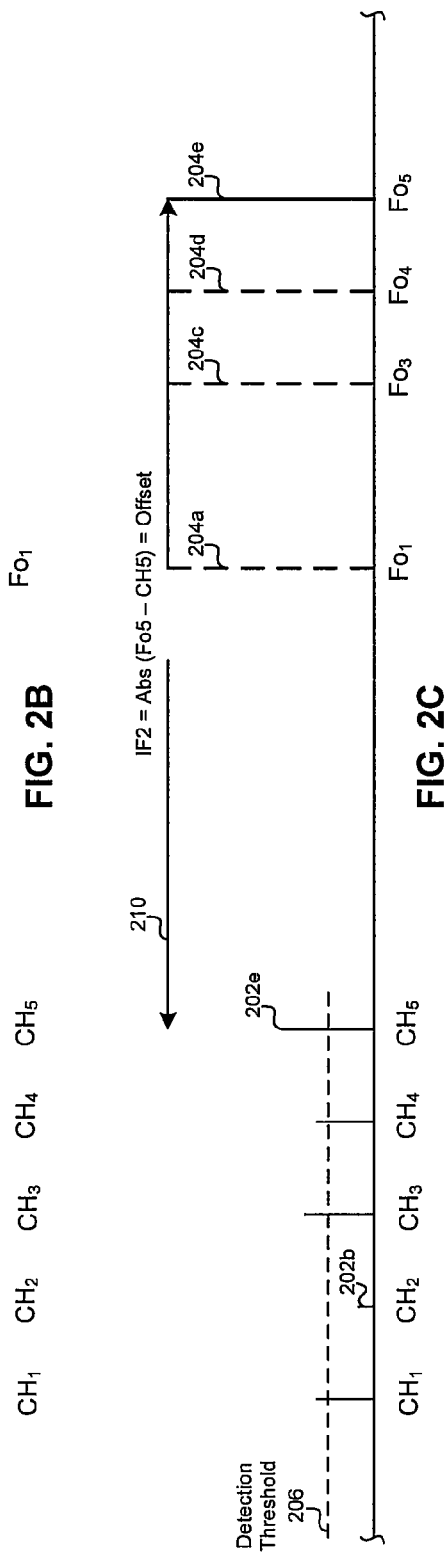

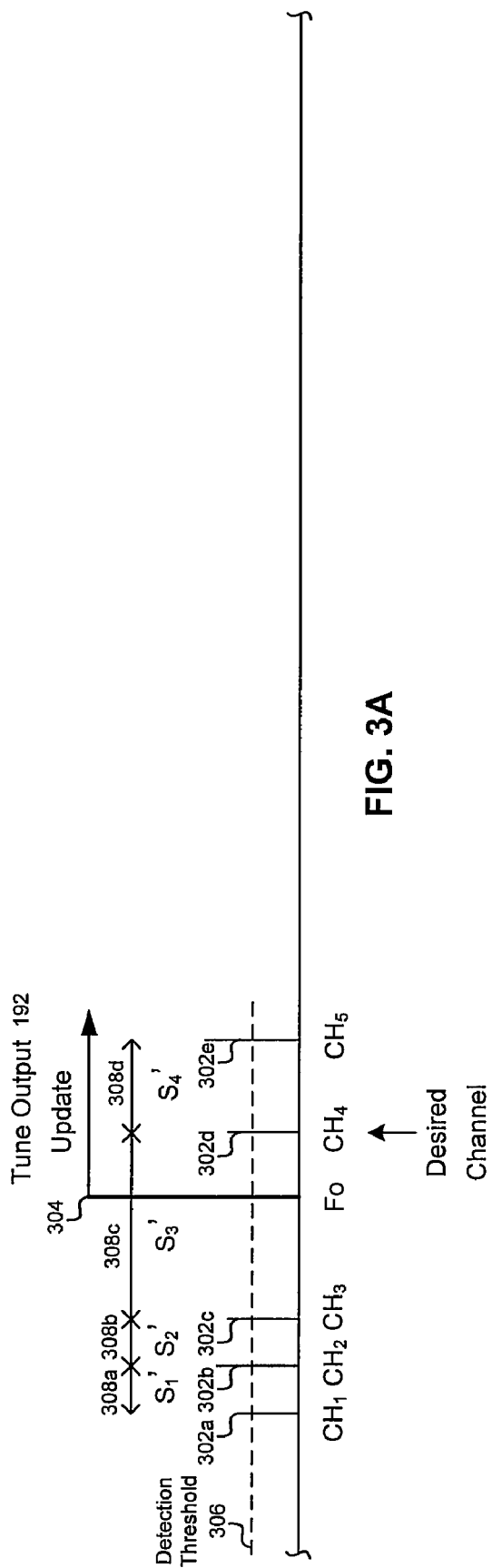
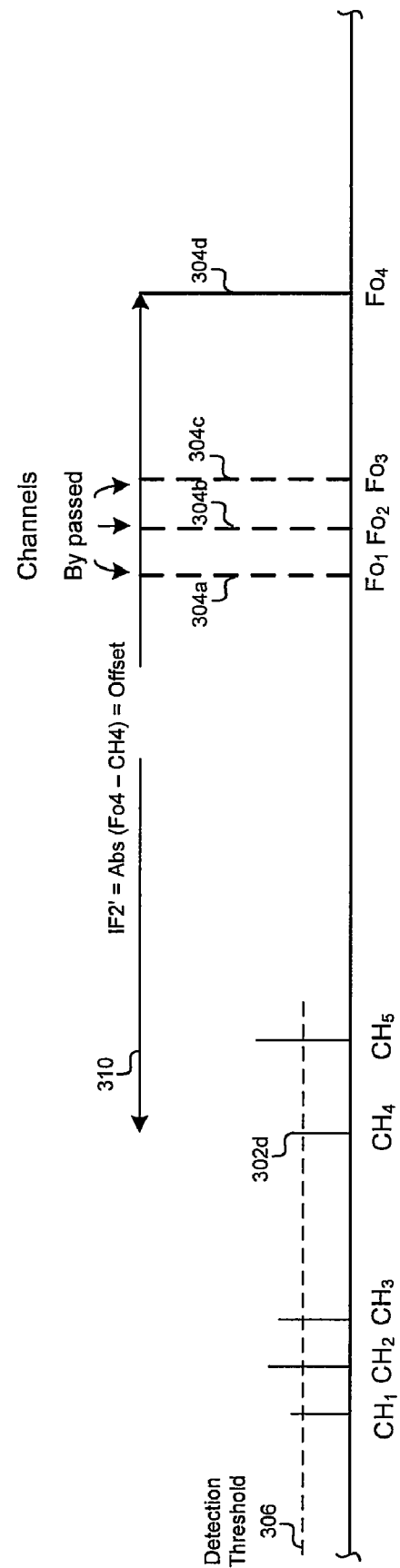
FIG. 3A
FIG. 3B

METHOD AND SYSTEM FOR PROCESSING CHANNELS IN A FM COMMUNICATION SYSTEM

CROSS-REFERENCE TO RELATED APPLICATIONS/INCORPORATION BY REFERENCE

This application makes reference to: U.S. application Ser. No. 11/286,555 filed on Nov. 22, 2005.

The above stated application is hereby incorporated herein by reference in its entirety.

FIELD OF THE INVENTION

Certain embodiments of the invention relate to wireless communication. More specifically, certain embodiments of the invention relate to a method and system for processing channels in a FM communication system.

BACKGROUND OF THE INVENTION

Frequency Modulation (FM) is a form of modulation in wireless communication which represents information as variations in the instantaneous center frequency of a carrier wave. Digital data can be transmitted by shifting the carrier frequency among a set of discrete values, a technique known as frequency-shift keying. FM requires a wider bandwidth than amplitude modulation by an equivalent modulating signal, but this also makes the signal more robust against noise and interference. Frequency modulation was chosen as the modulation standard for high frequency. A plurality of FM frequencies (channels) each separated by a frequency spacing may be broadcasted by a transmitter tower or a radio station.

A FM receiver of a FM radio includes a tuner with a tunable local oscillator (LO) to scan or search for frequency channels. Scanning may be performed by tuning the LO across the full tuning range of the LO or sweep the LO back and forth over a narrower tuning range to search for a signal of interest such as a FM channel. A FM channel may be detected or tuned if the FM receiver can successfully process a signal of sufficient signal amplitude; and/or the tuner is able to establish an intermediate frequency (IF) signal that is substantially the same or close to a defined offset of the FM receiver. When signals of two same frequencies (from different broadcast stations) are received by the FM receiver, the FM receiver may process the stronger of two signals being broadcasted on the same frequency.

Received signal strength is indicated by Received Signal Strength Indication, RSSI. RSSI is directly known to users of wireless networking of IEEE 802.11 protocol family and may be measured in the IF stage before the IF amplifier. The RSSI output is often a DC analog level. It can also be sampled by an internal ADC and the resulting codes available directly or via peripheral or internal processor. If a signal level is above a detection threshold, the logic level of RSSI may be set to high, otherwise RSSI may be set to low.

Sometimes the broadcasted channel frequencies may drift due to old transmitters lacking frequency stability or due to equipment defect. A tuning error may occur resulting in unsuccessful channel detection if the channel frequency drift exceeds certain acceptable range. Likewise frequency drift in the LO of the FM receiver may cause a failure in channel detection. Using high stability frequency sources in the transmitter and/or the FM receiver may improve channel detection success. Frequency source stability may be improved where the output frequency source is locked to a highly stable reference using a feedback circuit. The principle of phase locked loops is well known in the art and its discussion is beyond the scope of the invention.

FM signals may be broadcasted in the Radio Data System (RDS) or Radio Broadcast Data System (RBDS) standard format. The RDS data format may contain information such as alternate frequencies of the broadcast station, the clock time, program identification with known channel frequency, channel spacing, station ID, country code or country identity, regional links and Enhanced Other Networks (EON) etc. Portable electronic devices and wireless devices feature a high number of available channels. For example, a driver entering a new area served by different broadcast stations whose FM receiver may need to scan up to all available channels to locate a desired channel. Depending on the country and the channel spacing, the processing to a desired channel may result in a long delay.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A method and system for processing channels in a FM communication system, substantially as shown in and/or described in connection with at least one of the figures, as set forth more completely in the claims. These and other advantages, aspects and novel features of the present invention, as well as details of an illustrated embodiment thereof, will be more fully understood from the following description and drawings.

BRIEF DESCRIPTION OF SEVERAL VIEWS OF THE DRAWINGS

FIG. 2A is a diagram illustrating an initial scanning process for channel tuning of a FM receiver in a frequency spectrum, in accordance with an embodiment of the invention.

FIG. 2B is a diagram illustrating a channel scanning process of the FM receiver upon detection of a channel in a frequency spectrum, in accordance with an embodiment of the invention.

FIG. 2C is a diagram illustrating the completion of channel scanning process of the FM receiver in a frequency spectrum, in accordance with an embodiment of the invention.

FIG. 3A is a diagram illustrating an initial scanning process for channel tuning of a FM receiver in a frequency spectrum, in accordance with an embodiment of the invention.

FIG. 3B is a diagram illustrating an expedient channel tuning process based on information inputs to a FM receiver in a frequency spectrum, in accordance with an embodiment of the invention.

DETAILED DESCRIPTION OF THE INVENTION

Certain embodiments of the invention may be found in a method, system for processing channels in a FM communication system. In an aspect of the invention, the FM communication system may comprise adjusting a tuning frequency of a FM receiver for scanning and detecting an FM channel based on knowledge of location of the FM receiver, received signal strength indicator (RSSI), and/or carrier error of a related FM signal. The aforementioned information may be derived from preprogrammed information, updated from a previous scan, and/or received from one or more external inputs and may be used to configure the receiver for current or subsequent selective tuning. In another aspect of the invention, the selective channel tuning of the receiver may be dynamic and may bypass a plurality of available channels without performing a full scan.

Figure 1A:
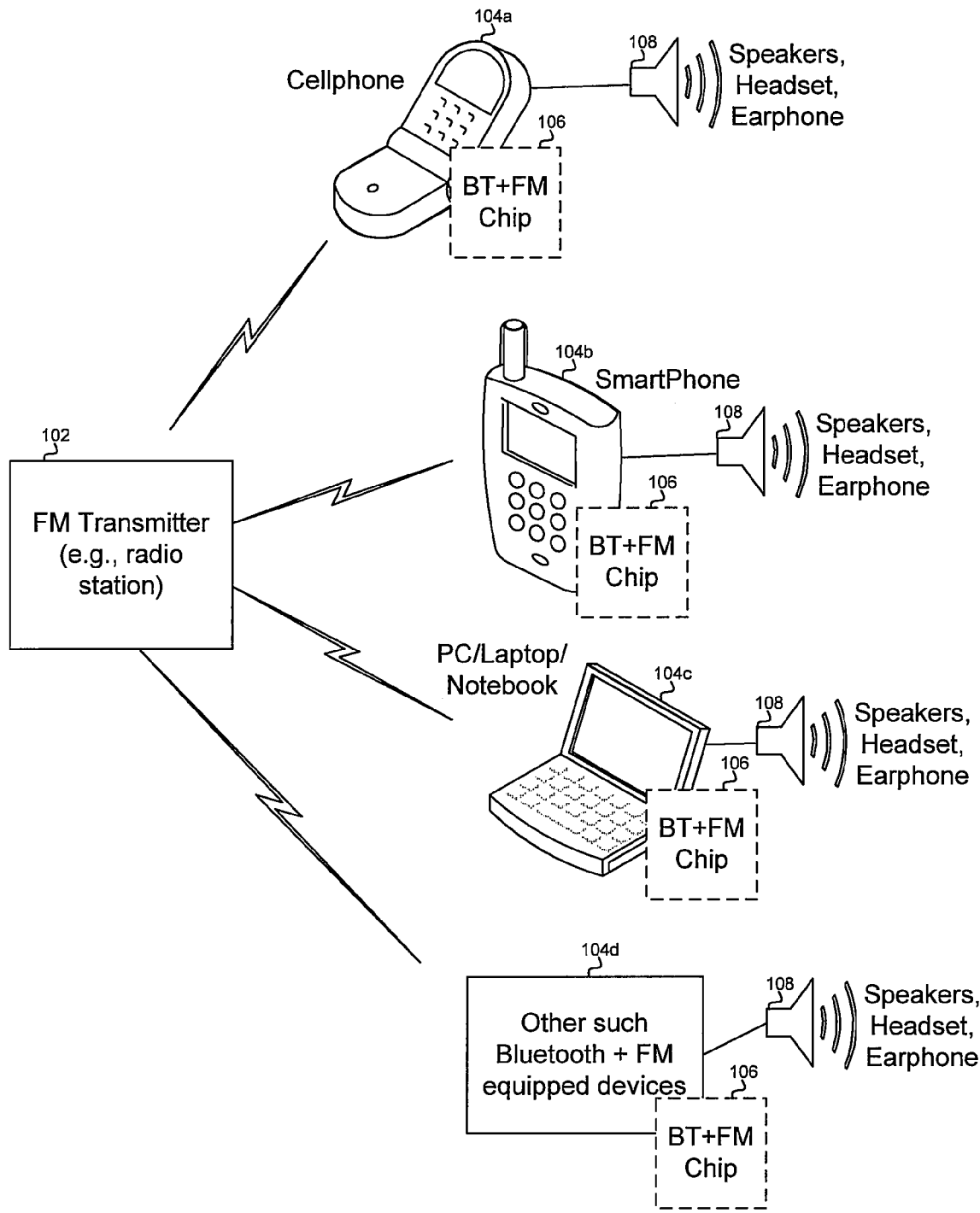
FIG. 1A is a block diagram of an exemplary FM transmitter that communicates with devices with FM receivers, in accordance with an embodiment of the invention.

FIG. 1A is a block diagram of an exemplary FM transmitter that communicates with devices that with FM receivers, in accordance with an embodiment of the invention. Referring to FIG. 1A, there is shown an FM transmitter 102, a cellular phone 104a, a smart phone 104b, a computer 104c, and an exemplary FM and Bluetooth-equipped device 104d. The FM transmitter 102 may be implemented as part of a radio station or other broadcasting device, for example. Each of the cellular phone 104a, the smart phone 104b, the computer 104c, and the exemplary FM and Bluetooth-equipped device 104d may comprise a single chip 106 with integrated FM and Bluetooth radios for supporting FM and Bluetooth data communications. The integrated Bluetooth data communication may be included as an optional feature in the exemplary FM radio devices. The FM transmitter 102 may enable communication of FM audio data to the devices shown in FIG. 1A by utilizing the single chip 106. Each of the devices in FIG. 1A may comprise and/or may be communicatively coupled to a listening device 108 such as a speaker, a headset, or an earphone, for example. In other embodiments of the invention, the functions of the single chip 106 may be implemented as discrete components.

The cellular phone 104a may be enabled to receive an FM transmission signal from the FM transmitter 102. The user of the cellular phone 104a may then listen to the transmission via the listening device 108. The cellular phone 104a may comprise a "one-touch" programming feature that enables pulling up specifically desired broadcasts, like weather, sports, stock quotes, or news, for example. The smart phone 104b may be enabled to receive an FM transmission signal from the FM transmitter 102. The user of the smart phone 104b may then listen to the transmission via the listening device 108.

The computer 104c may be a desktop, laptop, notebook, tablet, and a PDA, for example. The computer 104c may be enabled to receive an FM transmission signal from the FM transmitter 102. The user of the computer 104c may then listen to the transmission via the listening device 108. The computer 104c may comprise software menus that configure listening options and enable quick access to favorite options, for example. In one embodiment of the invention, the computer 104c may utilize an atomic clock FM signal for precise timing applications, such as scientific applications, for example. While a cellular phone, a smart phone, computing devices, and other devices have been shown in FIG. 1A, the single chip 106 may be utilized in a plurality of other devices and/or systems that receive and use FM and/or Bluetooth signals. In one embodiment of the invention, the single chip FM and Bluetooth radio may be utilized in a system comprising a WLAN radio. The U.S. application Ser. No. 11/286,844, filed on Nov. 22, 2005, discloses a method and system comprising a single chip FM and Bluetooth radio integrated with a wireless LAN radio, and is hereby incorporated herein by reference in its entirety. In another embodiment of the invention, the devices 104a to 104d shown in FIG. 1A may comprise a Global Positioning System (GPS) receiver to receive device location information.

Figure 1B:
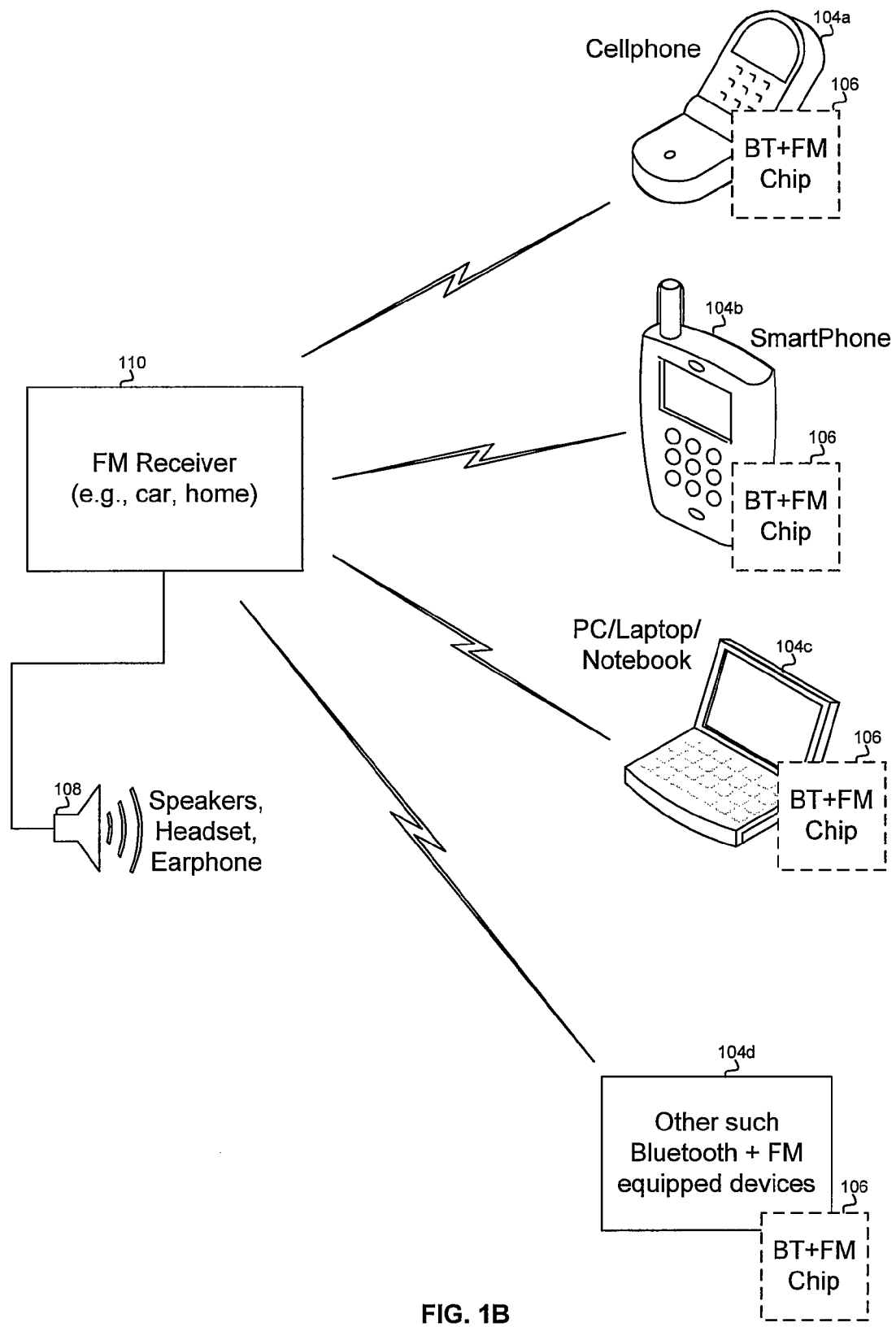
FIG. 1B is a block diagram of an exemplary FM receiver that communicates With devices transmitting a plurality of FM channels, in accordance with an embodiment of the invention.

FIG. 1B is a block diagram of an exemplary FM receiver that communicates with handheld devices that utilize a single chip with integrated Bluetooth and FM radios, in accordance with an embodiment of the invention. Referring to FIG. 1B, there is shown an FM receiver 110, the cellular phone 104a, the smart phone 104b, the computer 104c, and the exemplary FM and Bluetooth-equipped device 104d. In this regard, the FM receiver 110 may comprise and/or may be communicatively coupled to a listening device 108. A device equipped with the Bluetooth and FM transceivers, such as the single chip 106, may be able to broadcast its respective signal to a "deadband" of an FM receiver for use by the associated audio system. For example, a cellphone or a smart phone, such as the cellular phone 104a and the smart phone 104b, may transmit a telephone call for listening over the audio system of an automobile, via usage of a deadband area of the car's FM stereo system. One advantage may be the universal ability to use this feature with all automobiles equipped simply with an FM radio with few, if any, other external FM transmission devices or connections being required.

In another example, a computer, such as the computer 104c, may comprise an MP3 player or another digital music format player and may broadcast a signal to the deadband of an FM receiver in a home stereo system. The music on the computer may then be listened to on a standard FM receiver with few, if any, other external FM transmission devices or connections. While a cellular phone, a smart phone, and computing devices have been shown, a single chip that combines an optional Bluetooth and FM transceiver and/or receiver may be utilized in a plurality of other devices and/or systems that receive and use an FM signal.

Figure 1C:
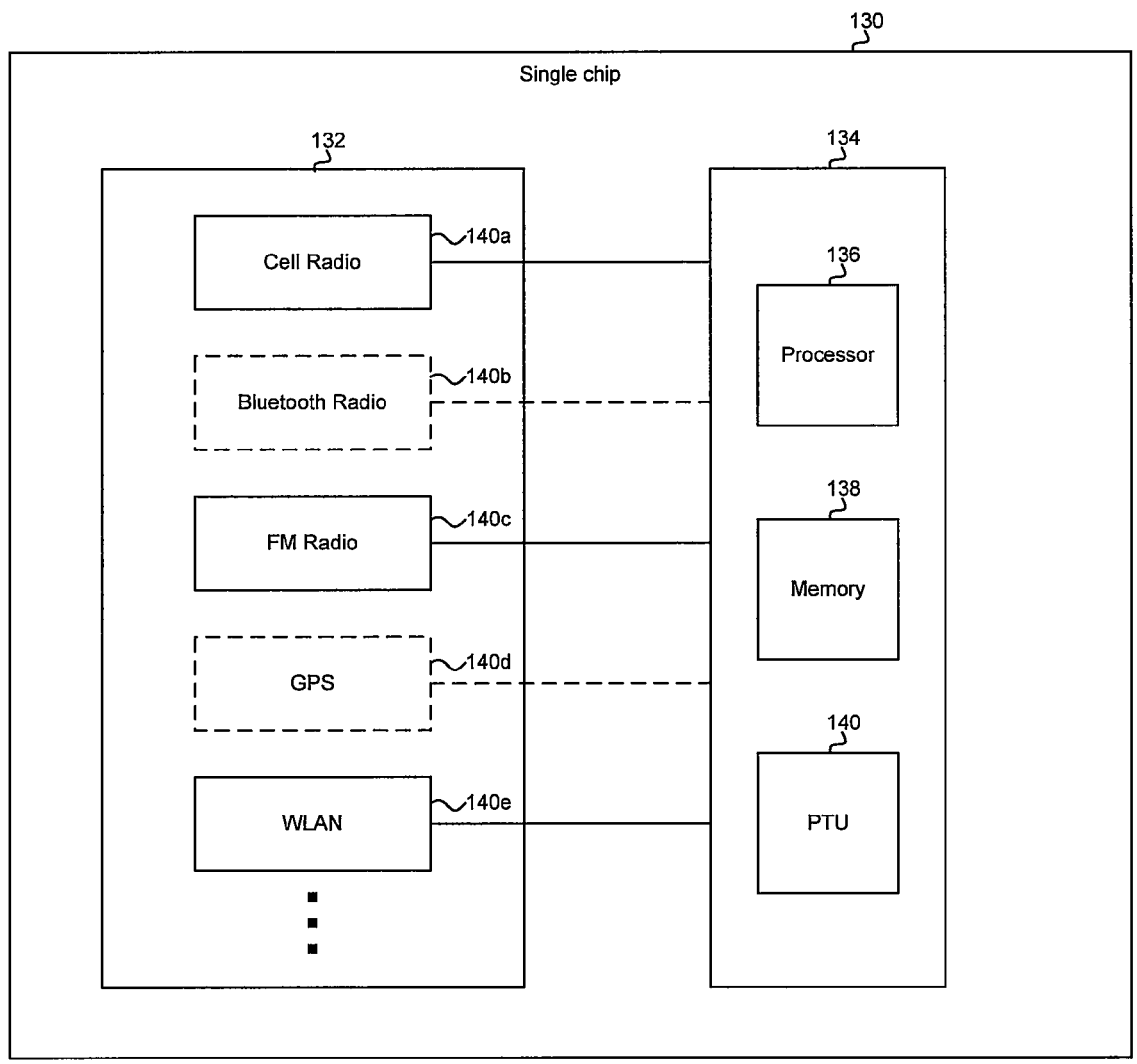
FIG. 1C is a block diagram of an exemplary single chip with multiple integrated radios that supports radio data processing, in accordance with an embodiment of the invention.

FIG. 1C is a block diagram of an exemplary single chip 130 with multiple integrated radios that supports radio data processing, in accordance with an embodiment of the invention. A single chip 130 that may comprise a radio portion 132 and a processing portion 134. The radio portion 132 may comprise a plurality of integrated radios. For example, the radio portion 132 may comprise a cell radio 140a that supports cellular communications, a Bluetooth radio 140b that supports Bluetooth communications, an FM radio 140c that supports FM communications, a global positioning system (GPS) 140d that supports GPS communications, and/or a wireless local area network (WLAN) 140e that supports communications based on the IEEE 802.11 standards.

The processing portion 134 may comprise at least one processor 136, a memory 138, and a peripheral transport unit (PTU) 140. The processor 136 may comprise suitable logic, circuitry, and/or code that enable processing of data received from the radio portion 132. In this regard, each of the integrated radios may communicate with the processing portion 134. In some instances, the integrated radios may communicate with the processing portion 134 via a common bus, for example. The memory 138 may comprise suitable logic, circuitry, and/or code that enable storage of data that may be utilized by the processor 136. In this regard, the memory 138 may store at least a portion of the data received by at least one of the integrated radios in the radio portion 132. In an embodiment of the invention, the data may comprise knowledge of location of FM radio 140c, received signal strength indicator (RSSI), carrier error of a related FM signal. The PTU 140 may comprise suitable logic, circuitry, and/or code that may enable interfacing data in the single chip 130 with other devices that may be communicatively coupled to the single chip 130. In this regard, the PTU 140 may support analog and/or digital interfaces.

Figure 1D:
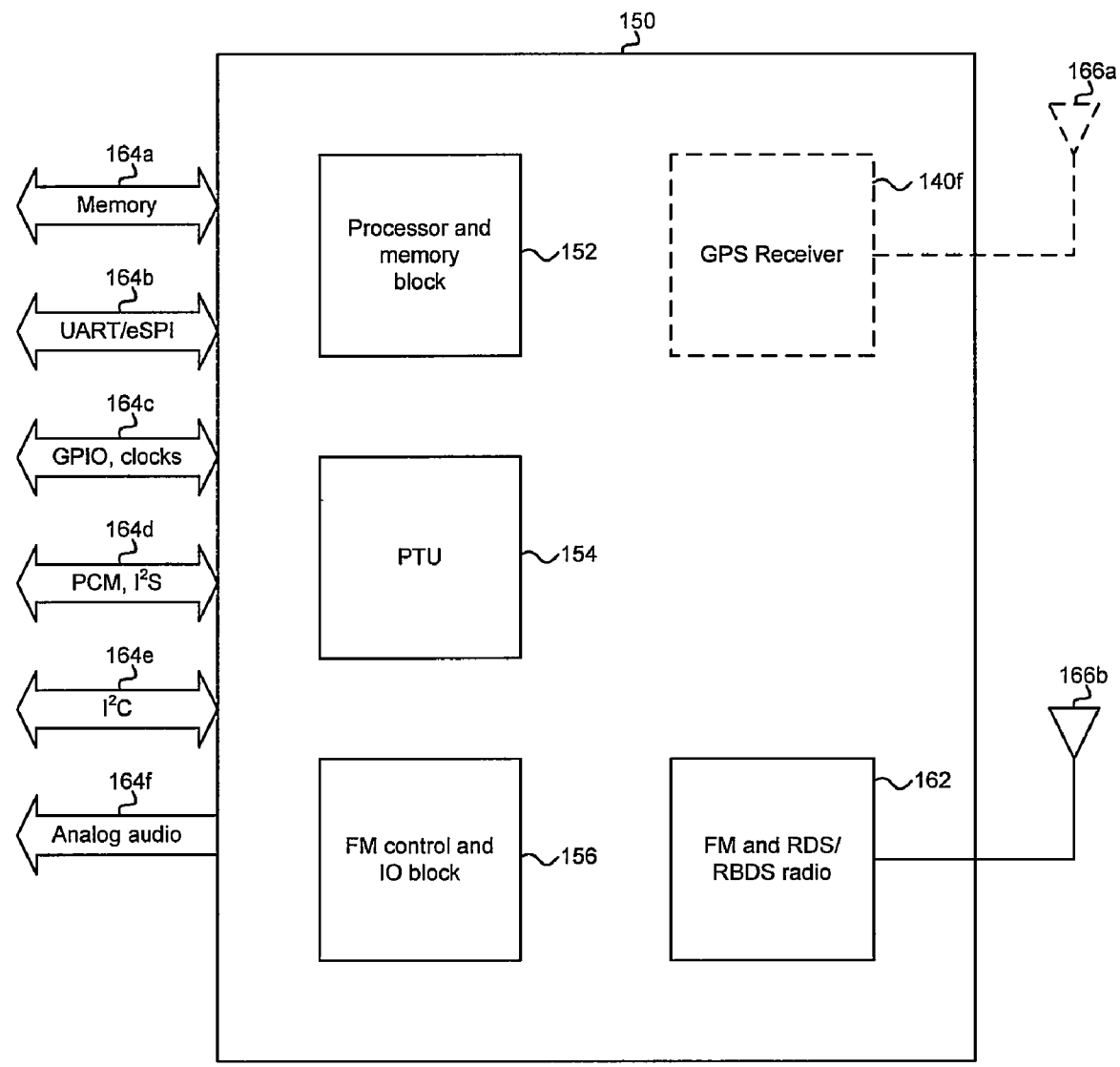
FIG. 1D is a block diagram of an exemplary single chip with integrated GPS receiver and FM radio that supports multiple interfaces, in accordance with an embodiment of the invention.

FIG. 1D is a block diagram of an exemplary single chip with integrated FM radios that supports multiple interfaces, in accordance with an embodiment of the invention. Referring to FIG. 1F, there is shown a single chip 150 that supports GPS and FM radio communications. The single chip 150 may comprise a processor and memory block 152, a PTU 154, an FM control and input-output (IO) block 156, a GPS receiver 140f, and an FM and radio data system (RDS) and radio broadcast data system (RDBS) radio 162. A first antenna or antenna system 166a may be communicatively coupled to the GPS receiver 140f. A second antenna or antenna system 166b may be communicatively coupled to the FM and RDS/RBDS radio 162.

The processor and memory block 152 may comprise suitable logic, circuitry, and/or code that may enable control, management, data processing operations, and/or data storage operations, for example. The PTU 154 may comprise suitable logic, circuitry, and/or code that may enable interfacing the single chip 150 with external devices. The FM control and IO block 156 may comprise suitable logic, circuitry, and/or code that may enable control of at least a portion of the FM and RDS/RBDS radio 162. The GPS receiver 140f may comprise suitable logic, circuitry, and/or code that may enable GPS communications via the first antenna 166a. The FM and RDS/RBDS radio 162 may comprise suitable logic, circuitry, and/or code that may enable FM, RDS, and/or RBDS data communication via the second antenna 166b.

The PTU 154 may support a plurality of interfaces. For example, the PTU 154 may support an external memory interface 164a, a universal asynchronous receiver transmitter (UART) and/or enhanced serial peripheral interface (eSPI) interface 164b, a general purpose input/output (GPIO) and/or clocks interface 164c, a pulse-code modulation (PCM) and/or an inter-IC sound ($I^2S$) interface 164d, an inter-integrated circuit ($I^2C$) bus interface 164e, and/or an audio interface 164f.

Figure 1E:
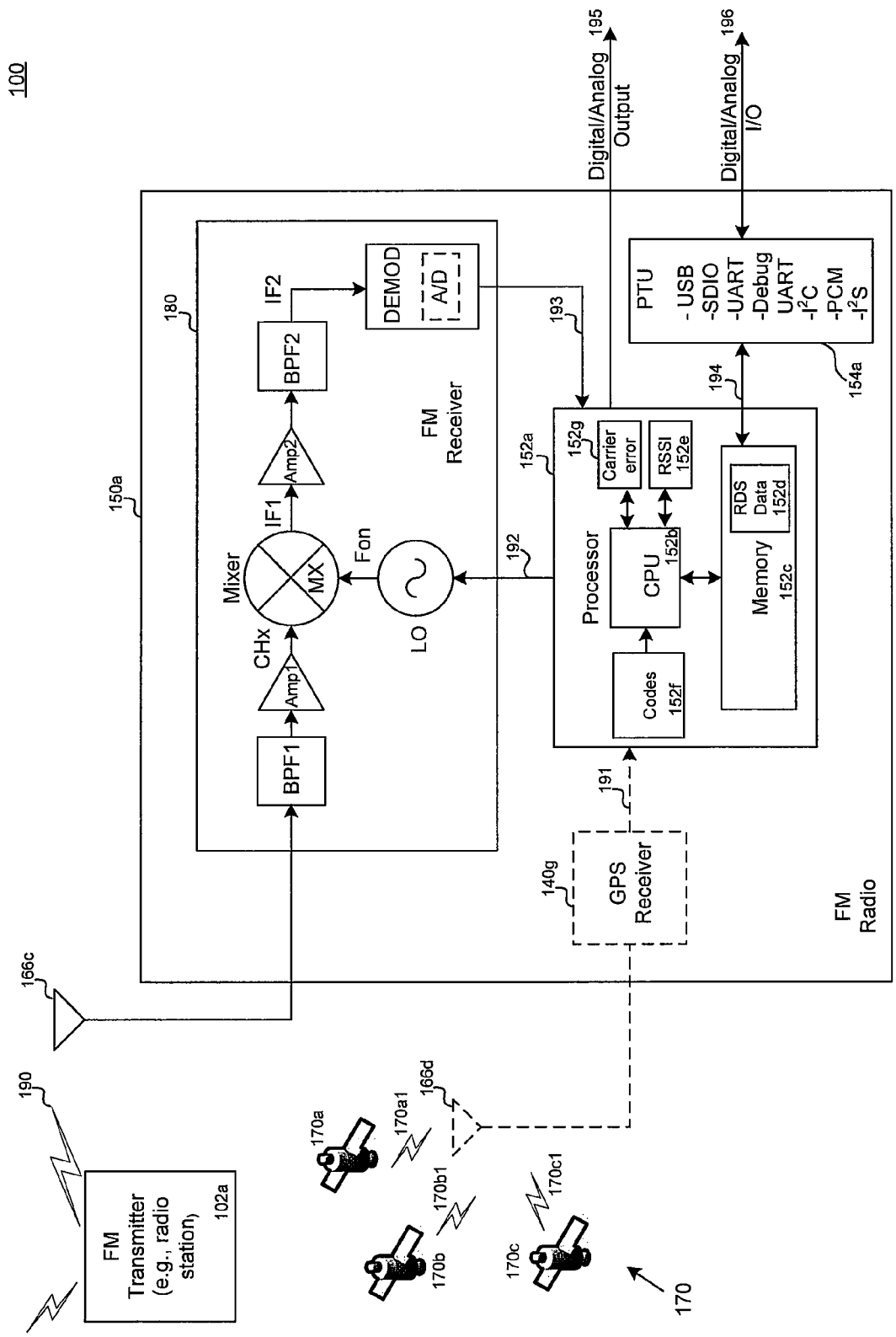
FIG. 1E is a block diagram of an exemplary FM communication system where a FM radio communicates with a FM transmitter, in accordance with an embodiment of the invention.

FIG. 1E is a block diagram of an exemplary FM communication system where a FM radio communicates with a FM transmitter, in accordance with an embodiment of the invention. Referring to the FM communication system 100 in FIG. IE, there is shown a FM transmitter or radio broadcast station 102a, a FM radio 150a, and an optional GPS system 170.

The FM transmitter 102a may comprise at least a frequency source, an amplifier, an antenna and a processor with suitable logic, circuitry, and/or code that enable transmission of FM signals 190 by frequency modulation scheme. The FM signals 190 may be broadcasted in the RDS/RBDS standard containing information identifying such as alternate frequencies of the station 102a, channel spacing, the clock time, broadcasted program identification with known station ID, country code or country identity, regional links and Enhanced Other Networks (EON) etc. The RDS data 152d may be stored and retrieved from a memory 152c of the FM radio 150a for dynamic tuning input.

The FM radio 150a may comprise a FM receiver 180 with an antenna 166c, an optional GPS receiver 140g with an optional GPS antenna 166d, a processor 152a and a Peripheral Transport Unit (PTU) 154a. In an embodiment of the invention, the functions of the FM radio 150a may be implemented with discrete components. In an alternate embodiment, the FM radio 150a may be implemented as a single chip integrating the optional GPS receiver 140g, the FM receiver 180, the processor 152a and the PTU 154a on the same chip.

The FM receiver 180 may be coupled to the antenna 166c to communicate FM signals 190 from the FM transmitter 102a. The FM receiver 180 may comprise a first and second band pass filters BPF1 and BPF2, a first and second amplifiers AMP1 and AMP2, a local oscillator LO, a mixer MX, a demodulator DEMOD and optionally an analog to digital converter A/D.

The first band pass filter BPF1 may substantially suppresses most of unwanted out of band FM signals 190. The first amplifier AMP1 may be a low noise amplifier that amplifies the filtered FM signal level as channel signals CHx. The channel signals CHx, also known as the frequency modulated carrier signals, may each be spaced apart at the center frequency by a defined channel frequency separation. The channel signals CHx may also be separated by multiples of the defined channel frequency separations. The channel signals CHX may commonly be down converted for the ease of signal processing using a mixer MX by mixing the channel signals CHX of suitable amplitude with a high side or low side local oscillator LO at frequencies Fon to produce a lower intermediate frequency signal IF1 of a defined offset suitable for demodulation or signal processing.

In an embodiment of the invention, the frequency Fon of the local oscillator LO may be dynamically tuned or adjusted upward or downward in response to an input 192 from the processor 152a. Such dynamic frequency adjustment may be known as channel tuning or scanning. In an embodiment, the LO may scan across an entire local oscillator LO tuning range by tuning the local oscillator LO from the lowest frequency to the highest frequency or vice versa. When a potential channel signal CHx is detected within the LO tuning range, an intermediate frequency signal IF1 may be detected (tuned channel).

The output signal IF1 of the mixer MX may comprise other undesirable mixing products as sidebands above or below the desired signal IF1. Due to conversion loss in the mixing process, the signal 1F1 may be further amplified by amplifier AMP2 and filtered by filter BPF2 to yield a signal IF2 substantially lack of sideband or spurious signals of detectable amplitude. The signal IF2 is suitable for signal processing. The signal IF2 may be demodulated by demodulator DEMOD and optionally processed by an A/D to produce a digital signal 193 used as an input to be further processed by the processor 152a. In an alternate embodiment of the invention, the signal IF2 may be demodulated and used as an input directly into the processor 152a. A general relationship of the signals CHx, Fon and IF2 may be shown as:

$$IF2 = Abs(Fon - CHx)$$

where the signal IF2 is an intermediate frequency. It may be shown that if the frequency of the LO signal Fon varies during the scanning process, the frequency of the signal IF2 may change by the same quantity. If the channel signal CHx is successfully detected, the signal IF2 should be substantially the same or close to a defined offset unique to the FM receiver 180. Thus, the offset is kept at a substantially constant value from channel to channel where the adjacent channels are separated by one or more multiples of channel spacing.

One of the tuned conditions may be a small carrier error 152g. A carrier error 152g may be generated if the frequency difference between the offset and the signal IF2 exceeds a certain limit. The magnitude of the carrier error 152g in combination with the logic level of RSSI may be used to for tuning even or odd channels of signals CHx or for channel spacing adjustment determination during scanning. The carrier error may be shown as:

$$\text{Carrier Error} = \text{Offset} - IF2.$$

If the carrier error 152g becomes too large, and the signal RSSI level is low, the channel may be ignored or by-passed for a next tuning selection. The channel frequency and channel spacing information may be updated in the processor 152a or stored in the memory 152c. If the carrier error 152g becomes too large, but the signal RSSI level is high, the processor 152a may mark the channels signals CHX to be tuned as even or odd channels using the same channel spacing. The details of the process will be discussed in FIG. 4C as a self measurement routine for offsets and channel spacing determination.

Occasionally the received FM signal 190 as channel signal CHX may be out of tune due to transmitter's frequency instability causing certain carrier error 152g. A phase locked loop circuit may be implemented in the local oscillator LO circuit to automatically track out the carrier error by periodically adjusting the local oscillator LO tuning frequency Fon such that the signal IF2 may be kept at a substantially constant frequency and the carrier error substantially small.

The optional GPS receiver 140g utilizes GPS time coded signals 170a1, 170b1 and 170c1 from GPS satellites 170a, 170b and 170c in space orbits. The time coded signals 170a1 to 170c1 may determine the location or position of the GPS receiver 140g based on time differences received from the GPS satellites 170a to 170c. The location information may be used as a form of input to identify the FM transmitter 102a. Once the relative location of the FM transmitter 102a is determined, the frequencies and other characteristics of the FM signals being broadcasted may be identified based on a look up table in the memory 152c of the processor 152a or from other external inputs 196 to be discussed later.

The processor 152a may comprise a CPU 152b, the memory 152c, suitable logic, circuitry, and/or code 152f that may enable control and/or management of tuning operations or process RSSI function 152e in the FM receiver 180. The processor 152a may process a plurality of inputs such as GPS input 191, demodulated channel signal input 193 or input 194 from PTU 154a. The processor 152a may also generate outputs 192, 194 and 195. The output 192 may dynamically tune or adjust the local oscillator LO frequency Fon. The output 194 to PTU may communicate to other external devices, output 195 as digital or analog signals.

The CPU 152b may comprise suitable logic, circuitry, and/or code that may enable control and/or management of inputs and output operations. In this regard, the CPU 152b may communicate control and/or management operations to the FM receiver 180, and/or the PTU 154a via a set of register locations specified in a memory map or RDS data 152d in memory 152c. The CPU 152b may enable processing of data 193 received via the FM receiver 180, and/or data 194 via the PTU 154a. For example, the CPU 152b may enable configuration of data routes to and/or from the FM receiver 180. For example, the CPU 152b may configure the FM receiver 180 such as flexible tuning, and/or searching operations in FM communication by bypassing channels. For example, the CPU 152b may generate at least one signal that tunes the FM receiver 180 to a certain frequency to determine whether there is a station at that frequency. When a station is found, the CPU 152b may configure a path for the audio signal to be updated in the memory 152c and processed in the FM radio 150a. When a station is not found, the CPU 152b may generate at least one additional signal that tunes the FM receiver 180 to a different frequency to determine whether a station may be found at the new frequency.

RSSI function 152e or RDS data 152d may be utilized in combination with codes 152f as a search algorithm for processing by the CPU 152b. The search algorithm may enable the FM receiver 180 to scan up or down in frequency from a presently tuned channel and stop on the next channel with RSSI function 152e to detect signals meeting above a detection threshold. The search algorithm may be able to distinguish image channels. The choice of the IF frequency during search is such that an image channel may have a nominal frequency error of 50 kHz, which may be used to distinguish the image channel from the "on" channel. The search algorithm may also be able to determine if a high side or a low side injection provides better receive performance, thereby allowing for a signal quality metric to be developed for this purpose. One possibility to be investigated is monitoring the high frequency RSSI relative to the total RSSI. The IF may be chosen so that with the timing accuracy that a receiver may be enabled to provide, the image channels may comprise a frequency error that is sufficiently large to differentiate the image channels from the on channel.

The memory 152c may comprise suitable logic, circuitry, and/or code that may enable data storage. In this regard, the memory 152c may be utilized to store RDS data 152d and RSSI function 152e information that may be utilized by the processor 152b to control and/or manage the tuning operations of the FM radio 150a. The RDS data 152d or RSSI function 152e information may be received via the PTU 154a and/or via the FM receiver 180.

The PTU 154a may comprise suitable logic, circuitry, and/or code that may enable communication to and from the FM radio 150a via a plurality of communication interfaces. In some instances, the PTU 154a may be implemented outside the FM radio 150a, for example. The PTU 154a may support analog and/or digital communication with at least one port. For example, the PTU 154a may support at least one universal series bus (USB) interface that may be utilized for Bluetooth data communication, at least one secure digital input/output (SDIO) interface that may also be utilized for Bluetooth data communication, at least one universal asynchronous receiver transmitter (UART) interface that may also be utilized for Bluetooth data communication, and at least one I$^2$C bus interface that may be utilized for FM control and/or FM and RDS data communication. The PTU 154a may also support at least one PCM interface that may be utilized for Bluetooth data communication and/or FM data communication, for example.

The PTU 154a may also support at least one inter-IC sound (I$^2$S) interface, for example. The I$^2$S interface may be utilized to send high fidelity FM digital signals to the CPU 152b for processing, for example. In this regard, the I²S interface in the PTU 154*a* may receive data from the FM receiver 180 via a bus, for example.

The RDS data 152*d* may be buffered in the memory 152*c* in the processor 152*a*. The RDS data 152*d* may be transferred from the memory 152*c* via the I²C interface when the CPU 152*b* is in a sleep or stand-by mode. For example, the FM receiver 180 may post RDS data 152*d* into a buffer in the memory 152*c* until a certain level is reached and an interrupt is generated to wake up the CPU 152*b* to process the RDS 152*d*. When the CPU 152*b* is not in a sleep mode, the RDS data 152*d* may be transferred to the memory 212 via the common bus 201, for example.

In one embodiment of the invention, the FM radio 150*a* may implement a search algorithm that collects and stores data during scanning of the FM band. The FM radio 150*a* may determine whether there is music or speech in a detected channel. Moreover, the single chip may enable searching and finding 10 of the strongest stations, for example, and may rank them.

In another embodiment of the invention, the FM radio 150*a* may implement a search algorithm where the searches may be done based on specific criteria such as type of station or type of music, for example. The single chip may characterize each of the stations found based on the search.

In an alternate embodiment of the invention, the FM radio 150*a* may be implemented in FM radios, cellular phones, MP3 players, TV tuners, wireless LAN (WLAN) radio, PDAs, handheld devices, laptop computers or any wireless communication devices.

FIG. 2A is a diagram illustrating an initial scanning process for channel tuning of a FM receiver in a frequency spectrum, in accordance with an embodiment of the invention. Referring to FIG. 2A, there is shown a plurality of signals including FM channels CH1 202*a* to CH5 202*e* and a local oscillator LO signal Fon as described in FIG. 1E.

In the absence of input from the memory 152*c* to the CPU 152*b* in the FM radio 150*a*, a local oscillator LO at initial tuning frequency Fon during turn on, may tune upward or downward across the entire LO tuning range. For channel processing or detection, the FM receiver 180 may determine the channel spacing to enable expedient LO tuning between channels. The LO may attempt to generate an IF signal after the Mixer MX, where IF2=Abs (Fon−CHx) as described with regard to FIG. 1E. Signals CH1 202*a* to CH5 202*e* may represent a plurality of consecutive FM channels within the tuning range of the local oscillator LO.

The FM receiver processor 152*a* may utilize the RSSI function 152*e* that may be enabled to set a detection threshold 206 for signals CH1 202*a* to CH5 202*e*. In certain instances, the signal CH2 202*b* being below the detection threshold 206, the RSSI may be set to low. In an embodiment of the invention, signal CH2 202*b* with low RSSI may not be marked and may be updated as not a valid channel in the memory 152*c*. This channel information may be used for future tuning request where signal CH2 202*b* may be bypassed.

FIG. 2B is a diagram illustrating a channel scanning process of a FM receiver upon detection of a channel in a frequency spectrum, in accordance with an embodiment of the invention. Referring to FIG. 2B, there is shown five consecutive signals CH1 202*a* to CH5 202*e* separated by substantially equal channel spacing S1 208*a* to S4 208*d*. In some instances, channel spacing S1 208*a* to S4 208*d* may also be referred as channel offsets. Channel spacing may vary from country to country and from station to station. In an embodiment, channel spacing S1 208*a* to S4 208*d* may each be separated by 100 KHz. In another embodiment, channel spacing S1 208*a* to S4 208*d* may each be separated by 200 KHz. In other embodiments, the channel spacing may be other larger or smaller values.

In an embodiment of the invention, for channel assignment in the database of FM receiver memory 152*c*, signals CH1 202*a*, CH3 202*c* and CH5 202*e* may be recorded as odd channels. Similarly signals CH2 202*b* and CH4 202*d* may be recorded as even channels.

In the process of scanning, the local oscillator LO as described in FIG. 1E may tune from the lower frequency range to upper frequency range or vice versa. The FM receiver 180 may set a frequency offset 210 as a reference value to process a carrier error 152*g*. If signal CH1 202*a* is successfully tuned to, an IF frequency signal IF2, where IF2=Abs (Fo1−CH1) may be substantially equal to the designated offset 210 of the FM receiver 180, FIG. 2C is a diagram illustrating the completion of channel scanning process of the FM receiver in a frequency spectrum, in accordance with an embodiment of the invention. Referring to FIG. 2C, there is shown a linear tuning process that may require the local oscillator LO as described in FIG. 1E to scan through frequencies Fo1 204*a*, Fo3 204*c* and Fo4 204*d* to tune to the available lower channels before reaching the final channel CH5 202*e* at the LO frequency Fo5 204*e*. Signal channel CH2 202*b* may not be tuned since the signal CH2 202*b* RSSI is set to low during the scanning process.

During scanning, carrier error 152*g* in each of the channel signals CH1 202*a* to CH5 202*e* may be checked at the respective IF frequencies in the FM receiver 180. Since the channel spacing S1 to S4 are constant, the LO may tune with step sizes of channel spacing S1 to S4. Since the RSSI 152*e* function residing in the processor 152*a* of the FM receiver 150*a* may ignore any signal below detection threshold 206, thus the LO may skip the tuning of channel CH2 202*b*. The memory 152*c* of the FM receiver may be updated in each scan operation where the updated information may be used to speed up future tuning.

FIG. 3A is a diagram illustrating an initial scanning process for channel tuning of a FM receiver in a frequency spectrum, in accordance with an embodiment of the invention. In FIG. 3A, the desired channel is channel CH4 302*d* but the FM radio 150*a* (as shown in FIG. 1E) is relocated to a location with different channel assignments or channel spacing. Referring to FIG. 3A, there is shown a plurality of FM channels CH1 302*a* to CH5 302*e* with signal level above the detection threshold 306, and a LO at frequency Fon receiving a tune output 192 to tune to a desired channel at CH4 302*d*. Also shown are the channel spacing S1' 308*a* to S4' 308*d*. Channel spacing S1' 308*a* and S2' 308*b* may be substantially equal to one channel space while channel spacing S3' 308*c* and S4' 308*d* may each be multiples of the channel spacing S1'.

FIG. 3B is a diagram illustrating an expedient channel tuning process based on information inputs to a FM receiver in a frequency spectrum, in accordance with an embodiment of the invention. Referring to FIG. 3B, there is shown the LO processes an expedient selective tuning directly to channel signal CH4 302*d* in accordance to an embodiment of the invention, bypassing channels signals 304*a* to 304*c*. The IF frequency IF2' may be a new offset based on the LO frequency Fo4 304*d* and channel frequency CH4 302*d*. In this illustration, the signals CH1 302*a* to CH5 302*e* may exceed the detection threshold 306 (RSSI set at high) and may be eligible for tuning selection. If one or more of channel signals CH1 302*a* to CH5 302*e* exceed the carrier error limit during scan, those channel signals may be selectively tuned at even, odd channels at the current channel spacing. In another instance, different channel spacing may be used for the scanning.

The tune output 192 from processor 152a (shown in FIG. 1E) may be based on information from at least one of the inputs: the FM receiver location, RSSI, carrier error of a related FM signal. Any additional input may also be used to update the output 192. The channel spacing S1' to S4' information along with the channel frequencies CH1 302a to CH5 302e may be read from a database in the memory 152c. The information in the memory 152c may be obtained from a previous scan, new PTU input 194, and the FM signals broadcasted in RDS format and/or in combination with GPS input 191. The received inputs and available information may be used to process the output 192 for channel processing.

The location of FM receiver 180 may be derived from a GPS receiver input 191. The RSSI and carrier error may be derived concurrently from the FM signals CH1 302a to CH5 302e. The FM receiver 180 and processor 152a may check the signal strength using RSSI 152e and update the RDS data 152d in the memory 152c and process a search algorithm to generate a LO output 192 to be discussed in details in FIGS. 4A to 4C.

Figure 4A:
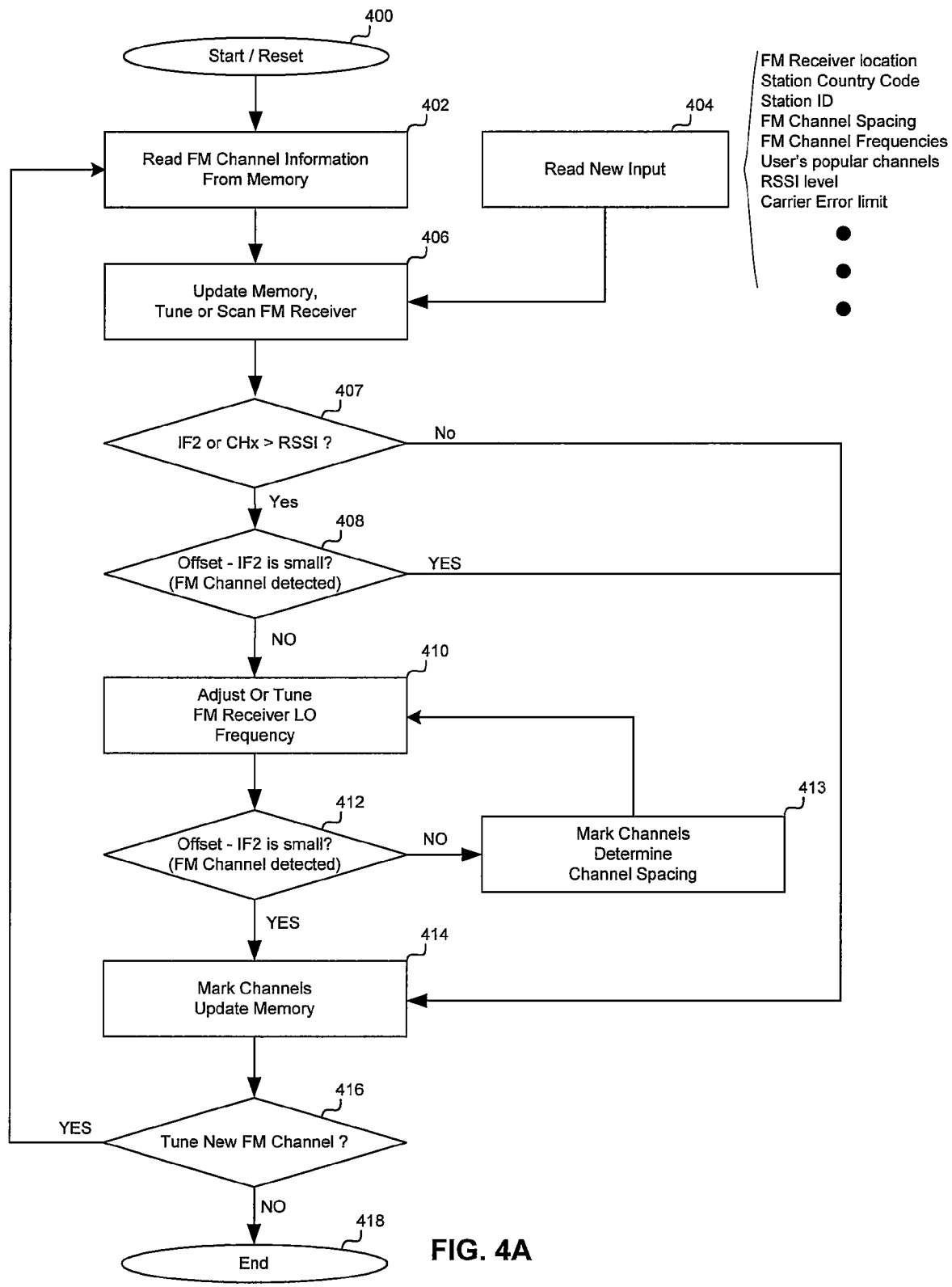
FIG. 4A is a flow chart that illustrates exemplary steps for processing receiver channel tuning in FM communication, in accordance with an embodiment of the invention.

FIG. 4A is a flow chart that illustrates exemplary steps for processing receiver channel tuning in FM communication, in accordance with an embodiment of the invention. Components in FIG. 1E may be referenced to throughout the flow charts description at various steps in both FIGS. 4A and 4B.

Step 400 represents an initial or a reset condition for a FM receiver 150a without knowledge of the location, channel frequencies and channel spacing information. In step 402, a processor 152a may read any available RDS data 152d in a memory 152c. The FM receiver may start with a default channel setting for a station such as tuning the LO from the low end of the band. The RDS data may be derived from a previous scan or from stored information which may for example, be retrieved from a preprogrammed database. Concurrently in step 404, new inputs 191,193 or 194 comprising FM receiver location, station country code or country identity, station ID, FM channel spacing, FM channel frequencies, signal RSSI level, carrier error limit or any user inputs such as favorite channels may be communicated to update the memory 152c and to the processor 152a.

In step 406, the processor generate an output 192 to tune the FM receiver local oscillator LO based on inputs from 191, 193 or 194 and from the updated memory 152c. The tuning output may facilitate scanning by tuning the LO in both direction (upward or downward) across a portion of or the entire tuning range. The tuning or scanning may comprise continuous tune or selective tuning by frequency hops.

In step 407, the FM receiver 180 RSSI function checks if the generated IF signal IF2 or the channel signal CHx exceeds a RSSI threshold level. The signal IF2 being the absolute frequency difference between the LO Fon and the channel signal CHx.

In step 408, if the IF signal IF2 or channel signal CHx exceeds the RSSI threshold level, the FM receiver 180 may determine whether any channel signal CHx is detected. Regarding step 408, there may be different ways to measure a successful channel tuning. In one embodiment of the invention, a successful channel tuning occurs when the carrier error is small, such as the difference of the offset and the IF frequency (IF2) being substantially small as earlier described in FIG. 1E.

In step 410, the processor 152a may generate an output to adjust the FM receiver LO by tuning the frequency upward or downward, if the offset and the IF frequency may not be close enough or the same in step 408.

In step 412, after FM receiver LO frequency adjustment, the FM receiver 180 may recheck for carrier error for successful channel signal CHx detection based on the same detection criteria in step 408. If channel signal CHx is not detected (high carrier error), continue in step 413.

In step 413, FM channel being not detected (carrier error is large) and channel spacing information may be incorrect. Various embodiments of the invention may be used to check the channel for further tuning or new channel spacing may be assigned for another scan. The algorithm will be further described in FIG. 4C.

In step 414, FM channel is detected (carrier error is small) and channel spacing information with channel signal CHx frequency being confirmed. Each detected channel may be marked as even channel or odd channel with corresponding frequencies as earlier described in FIG. 2B. The memory 152c may be updated with the latest channel information such as channel spacing number of even channels and number of odd channels or other tuning criteria. If the current channel spacing had been adjusted to achieve channel detection, the memory 152c may also be updated with the new channel spacing and channel frequency information for a future scan.

In step 416, the FM receiver 180 may check for any new channel tuning output from the processor 152a. If there is a new channel tuning output from the processor 152a, the processor will repeat step 402 or with input from step 404 to tune for a new channel signal, if no new channel tuning output, continue in step 418.

In step 418, in instances where there may be no new channel tuning output from the processor 152a, the FM receiver may stay on the tuned channel signal and end tuning process.

In step 407, in instances where the IF signal IF2 or channel signal CHx may be less than the RSSI threshold level, the FM receiver 180 may ignore the signal CHx and continue in step 416 to update the memory 152c and ready for tuning to another available channel signal CHx.

In step 408, in instances where the IF2 and the offset frequencies may be substantially close or equal, the channel signal CHx may be detected continue in step 416 to update the memory 152c and ready for tuning to another available channel signal CHx.

Figure 4B:
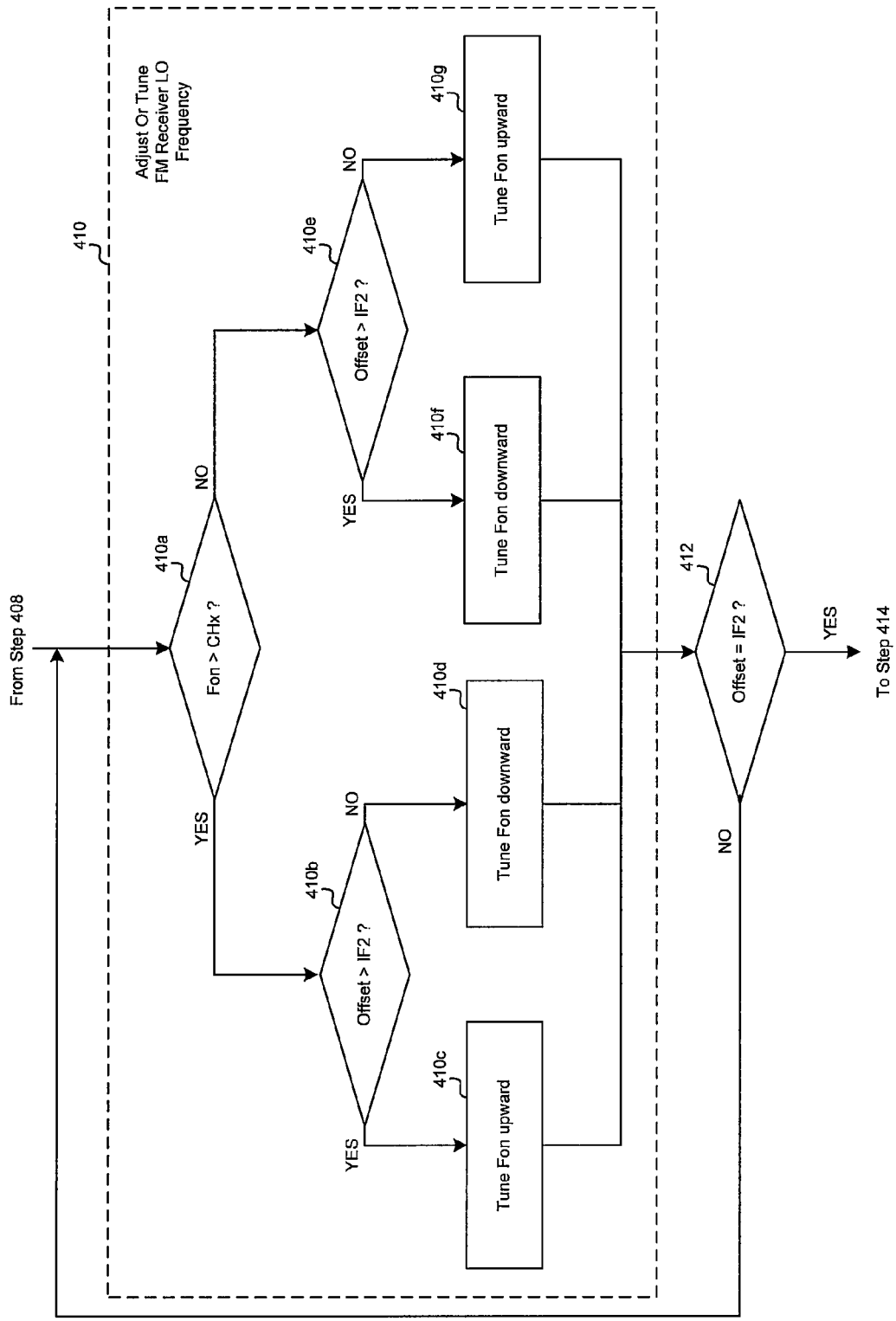
FIG. 4B is a flow chart that illustrates exemplary steps for dynamically adjusting or tuning of a FM receiver LO frequency, in accordance with an embodiment of the invention.

FIG. 4B is a flow chart that illustrates exemplary steps for dynamically adjusting or tuning a FM receiver LO frequency, in accordance with an embodiment of the invention. Step 410 may comprise exemplary steps 410a to 410g to illustrate how the FM receiver LO frequency may be adjusted to counter a tuning error such as a carrier error in channel signal CHx detection.

In step 410a, the FM receiver may comprise suitable logic, circuitry, and/or code that may enable determination of the LO frequency Fon is above or below the channel signal CHx. A frequency dependent output proportional to the frequency and phase difference between the LO frequency Fon and channel signal CHx may be determined. In an embodiment, a frequency discriminator (not shown) may be integrated into the FM receiver to perform the equivalent function. In instances where the LO frequency Fon may be greater than the channel signal CHx, the exemplary steps may continue to step 410b, otherwise the exemplary steps may continue to step 410e.

In step 410b, the FM receiver 180 may determine whether the offset frequency may be greater than the intermediate frequency IF2. In instances where the offset frequency may be greater, control may pass to step 410c. In instances where the offset may not be greater, control may pass to step 410d.

In step 410c, the LO frequency Fon is greater than the channel signal CHx and the offset frequency may be greater than the intermediate frequency IF2. The processor 152a may be enabled to generate an output signal 192 to tune the LO frequency Fon upward.

In step 410d, the LO frequency Fon may be greater than the channel signal CHx and the offset frequency may not be greater than the intermediate frequency IF2. The processor 152a may be enabled to generate an output signal 192 to tune the LO frequency Fon downward.

In step 410e, the FM receiver 180 may be enabled to check whether the offset frequency may be greater than the intermediate frequency IF2. In instances where the offset frequency may be greater, control may pass to step 410f. In instances where the offset frequency may not be greater, control may pass to step 410g.

In step 410f, the LO frequency Fon may not be greater than the channel signal CHx and the offset frequency may be greater than the intermediate frequency IF2. The processor 152a may be enabled to generate a signal 192 to tune the LO frequency Fon downward.

In step 410g, the LO frequency Fon may not be not greater than the channel signal CHx and the offset frequency may not be greater than the intermediate frequency IF2. The processor 152a may be enabled to generate a signal 192 to tune the LO frequency Fon upward.

After the tuning in steps 410c, 410d, 410f and 410g, the FM receiver 180 may be enabled to determine whether the channel signal CHx may be detected by checking whether the intermediate frequency offset or carrier error. In this instance, the frequency offset may be substantially the same or close to the signal IF2 in step 412 shown in FIG. 4A. Instances where the channel signal CHX may be detected, execution may continue to step 414. In instances where the channel signal may not be detected, the frequency tuning steps starting step 410a may be repeated.

Figure 4C:
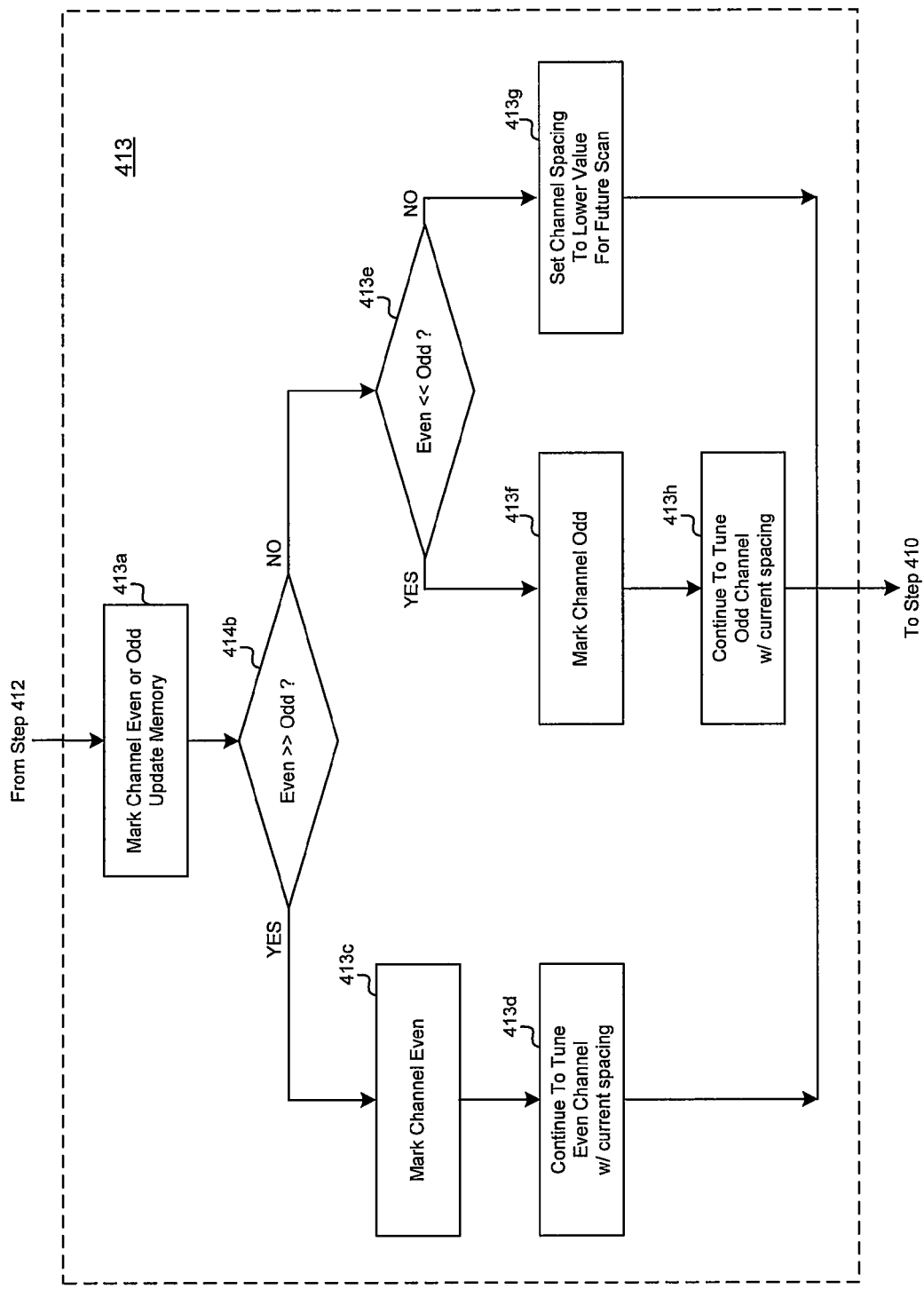
FIG. 4C is a flow chart that illustrates exemplary steps for channel spacing determination in a FM receiver, in accordance with an embodiment of the invention.

FIG. 4C is a flow chart that illustrates exemplary steps for channel spacing determination in a FM receiver, in accordance with an embodiment of the invention. Step 413 checks and adjust channel spacing by a self measurement routine to determine channel spacing such as S1 208a to S4 208d. Correct channel spacing such as S1 208a may be used for tuning to subsequent odd channels or even channels. In instance where the channel spacing may be incorrect, a different channel spacing higher or lower than the current channel spacing may be used for a next scan or LO adjustment in step 410.

In step 413a, channels may be marked as even channels such as CH2 202b and CH4 202d or odd channels such as CH1 202a, CH3 202c and CH5 202e with memory 152c updated. In step 413b, the processor 152a checks the updated memory to determine whether the even channels or the odd channels being greater. In step 413c, if even channels being much greater, the channels may be marked even. In step 413d the current channel spacing may be used to tune the subsequent even channels in step 410 at the current channel frequency.

In step 413e, the processor 152c may check whether the odd channels are much greater. In step 413f, if the number of odd channels is much greater, the channels may be marked odd. In step 413h, the current channel spacing may be used to tune the subsequent odd channels and determine from step 410 the current channel frequency. In step 413g, if the number of even channels and odd channels are close or near even, the current channel spacing used may be invalid. A new channel spacing may be used with a frequency value lower than or higher than the current channel spacing for tuning or a new scan in step 410.

The steps of the process in FIGS. 4A to 4C may be rearranged in a different order or substituted with similar or equivalent operation to accomplish the same tuning process without departing from the scope and spirit of the invention.

In accordance with various embodiments of the invention, processing channels in a FM communication system may comprise adjusting a tuning frequency Fon of a FM receiver 180 for scanning and detecting an FM channel CHx based at least one of the knowledge from a location of the FM receiver, a received signal strength indicator (RSSI) and a carrier error of a related FM signal CHx. The knowledge of the location of the FM receiver 180 may comprise the location identity, the country identity, and/or the FM station identity. The adjusting of the tuning frequency Fon of a FM receiver 180 may be done dynamically, for example, when the location of the FM receiver changes. Information for a detected FM channel CHx may be stored during scanning. The stored information may be retrieved and utilized for subsequent tuning to the detected FM channel CHx.

The tuning frequency utilized for scanning may be configured based on channel spacing S1 to S4 of local FM channels CH1 to CH5. The tuning frequency Fon utilized for scanning may also be configured based on local FM channel CHx availability. A frequency offset may be adjusted during scanning, where the frequency offset may be represented by the following relationship:

$$Abs(Fon-CHx)=IF2$$

when detection occurs, where the channel spacing and frequency offset may be derived from a self measurement method.

In another aspect of the invention, one or more FM channels CHx may be selectively bypassed during scanning. The bypassing of one or more FM channels CHx may be based on RSSI magnitude, carrier error, channel spacing, user input, and/or a preprogrammed selection.

Accordingly, the present invention may be realized in hardware, software, or a combination of hardware and software. The present invention may be realized in a centralized fashion in at least one computer system or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for processing channels in a FM communication system, the method comprising: adjusting a tuning frequency of a FM receiver for scanning and detecting an FM channel based on one or more of knowledge of location of said FM receiver, received signal strength indicator (RSSI), and carrier error of a related FM signal, wherein said adjusting utilizes channel spacing information based on determination of one of subsequent even and odd channels, or both of subsequent even and odd channels; and tuning said FM receiver utilizing channel spacing according to said even channels, if a number of said even channels is greater than a number of said odd channels, or utilizing channel spacing according to said odd channels, if a number of said odd channels is greater than a number of said even channels.

2. The method according to claim 1, wherein said adjusting is done dynamically as said location of said FM receiver changes.

3. The method according to claim 1, comprising storing information for a detected FM channel during said scanning.

4. The method according to claim 3, comprising retrieving said stored information for subsequent tuning to said detected FM channel.

5. The method according to claim 1, wherein said knowledge of said location of said FM receiver comprises one or more of: a location identity, a country identity, and a FM station identity.

6. The method according to claim 1, comprising configuring said tuning frequency utilized for said scanning based on channel spacing of local FM channel.

7. The method according to claim 1, comprising deriving frequency offsets and channel spacing of said detected FM channels based on a self measurement routine.

8. The method according to claim 1, comprising adjusting a frequency offset during said scanning.

9. The method according to claim 1, comprising bypassing one or more FM channels selectively during said scanning.

10. The method according to claim 9, comprising bypassing said one or more FM channels based on one or more of: a RSSI magnitude, a carrier error, channel spacing, user input, and a preprogrammed selection.

11. The method according to claim 1, wherein said channel spacing information is based on channel separation of said subsequent even channels, when said subsequent even channels are greater in number than said subsequent odd channels.

12. The method according to claim 1, wherein said channel spacing information is based on channel separation of said subsequent odd channels, when said subsequent odd channels are greater in number than said subsequent even channels.

13. The method according to claim 1, wherein said channel spacing information is reduced for a future scan, when said subsequent even and odd channels are substantially equal in number.

14. A non-transitory computer-readable storage medium having stored thereon, a computer program having at least one code section for processing channels in a FM communication system, the at least one code section being executable by a machine for causing the machine to perform steps comprising:

adjusting a tuning frequency of a FM receiver for scanning and detecting an FM channel based on one or more of knowledge of location of said FM receiver, received signal strength indicator (RSSI), and carrier error of a related FM signal, wherein said adjusting utilizes channel spacing information based on determination of one of subsequent even and odd channels, or both of subsequent even and odd channels; and tuning said FM receiver utilizing channel spacing according to said even channels, if a number of said even channels is greater than a number of said odd channels, or utilizing channel spacing according to said odd channels, if a number of said odd channels is greater than a number of said even channels.

15. The non-transitory computer-readable storage medium according to claim 14, wherein said adjusting is done dynamically as said location of said FM receiver changes.

16. The non-transitory computer-readable storage medium according to claim 14, wherein said at least one code section comprises code for storing information for a detected FM channel during said scanning.

17. The non-transitory computer-readable storage medium according to claim 16, wherein said at least one code section comprises code for retrieving said stored information for subsequent tuning to said detected FM channel.

18. The non-transitory computer-readable storage medium according to claim 14, wherein said knowledge of said location of said FM receiver comprises one or more of: a location identity, a country identity, and a FM station identity.

19. The non-transitory computer-readable storage medium according to claim 14, wherein said at least one code section comprises code for configuring said tuning frequency utilized for said scanning based on channel spacing of local FM channel.

20. The non-transitory computer-readable storage medium according to claim 14, wherein said at least one code section comprises code for deriving frequency offsets and channel spacing of said detected FM channels based on a self measurement routine.

21. The non-transitory computer-readable storage medium according to claim 14, wherein said at least one code section comprises code for adjusting a frequency offset during said scanning.

22. The non-transitory The computer-readable storage medium according to claim 14, wherein said at least one code section comprises code for bypassing one or more FM channels selectively during said scanning.

23. The non-transitory computer-readable storage medium according to claim 22, wherein said at least one code section comprises code for bypassing said one or more FM channels based on one or more of: a RSSI magnitude, a carrier error, user input, and a preprogrammed selection.

24. The non-transitory computer-readable storage medium according to claim 14, wherein said channel spacing information is based on channel separation of said subsequent even channels, when said subsequent even channels are greater in number than said subsequent odd channels.

25. The non-transitory computer-readable storage medium according to claim 14, wherein said channel spacing information is based on channel separation of said subsequent odd channels, when said subsequent odd channels are greater in number than said subsequent even channels.

26. The non-transitory computer-readable storage medium according to claim 14, wherein said channel spacing information is reduced for a future scan, when said subsequent even and odd channels are substantially equal in number.

27. A system for processing channels in a FM communication system, the system comprising:
- at least one processor that adjusts a tuning frequency of a FM receiver for scanning and detecting an FM channel based on one or more of knowledge of location of said FM receiver, received signal strength indicator (RSSI), and carrier error of a related FM signal, wherein said adjusting utilizes channel spacing information based on determination of one of subsequent even and odd channels, or both of subsequent even and odd channels; and
- said at least one processor tunes said FM receiver utilizing channel spacing according to said even channels, if a number of said even channels is greater than a number of said odd channels, or utilizes channel spacing according to said odd channels, if a number of said odd channels is greater than a number of said even channels.

28. The system according to claim 27, wherein said adjusting is done dynamically by said at least one processor as said location of said FM receiver changes.

29. The system according to claim 27, wherein said at least one processor stores information for a detected FM channel during said scanning.

30. The system according to claim 29, wherein said at least one processor retrieves said stored information for subsequent tuning to said detected FM channel.

31. The system according to claim 27, wherein said knowledge of said location of said FM receiver comprises one or more of: a location identity, a country identity, and a FM station identity.

32. The system according to claim 27, wherein said at least one processor configures said tuning frequency utilized for said scanning based on channel spacing of local FM channel.

33. The system according to claim 27, wherein said at least one processor derives frequency offsets and channel spacing of said detected FM channels based on a self measurement routine.

34. The system according to claim 27, wherein said at least one processor adjusts a frequency offset during said scanning.

35. The system according to claim 27, wherein said at least one processor bypasses one or more FM channels selectively during said scanning.

36. The system according to claim 35, wherein said at least one processor bypasses said one or more FM channels based on one or more of:
- a RSSI magnitude, a carrier error, channel spacing, user input, and a preprogrammed selection.

37. The system according to claim 27, wherein said channel spacing information is based on channel separation of said subsequent even channels, when said subsequent even channels are greater in number than said subsequent odd channels.

38. The system according to claim 27, wherein said channel spacing information is based on channel separation of said subsequent odd channels, when said subsequent odd channels are greater in number than said subsequent even channels.

39. The system according to claim 27, wherein said channel spacing information is reduced for a future scan, when said subsequent even and odd channels are substantially equal in number.

* * * * *